United States Patent [19]

Blanchard

[11] Patent Number: 4,692,995
[45] Date of Patent: Sep. 15, 1987

[54] METHOD OF OBTAINING A DIODE WHOSE CONTACT TAPPING IS SELF ALIGNED WITH A GATE

[75] Inventor: Pierre Blanchard, Echirolles, France

[73] Assignee: Thomson-CSF, Paris, France

[21] Appl. No.: 822,028

[22] Filed: Jan. 24, 1986

[30] Foreign Application Priority Data

Jan. 25, 1985 [FR] France ................. 85 01085

[51] Int. Cl.⁴ .................. H01L 21/225; H01L 21/265
[52] U.S. Cl. .................. 437/41; 148/DIG. 82; 437/233
[58] Field of Search .................. 29/571, 576 B, 578; 148/1.5, 175, 187

[56] References Cited

U.S. PATENT DOCUMENTS

| | | | |
|---|---|---|---|
| 4,247,861 | 1/1981 | Hsu et al. | 357/43 |
| 4,305,200 | 12/1981 | Fu et al. | 29/571 |
| 4,375,717 | 3/1983 | Tonnel | 29/576 B |
| 4,466,172 | 8/1984 | Batra | 29/576 B |
| 4,477,962 | 10/1984 | Godejan, Jr. | 29/571 |
| 4,486,943 | 12/1984 | Ryden et al. | 29/571 |
| 4,506,437 | 3/1985 | Godejan, Jr. | 29/571 |

FOREIGN PATENT DOCUMENTS 0051534 5/1982 European Pat. Off. .
2464561 3/1981 France .

OTHER PUBLICATIONS

IEEE Electron Device Letters, vol. EDL-3, No. 2, Feb. 1982, pp. 40-42, IEEE, New York, U.S.; S. Hsia et al.: "Polysilicon Oxidation Self-Aligned . . . ".
IBM Technical Disclosure Bulletin, vol. 22, No. 8B, Jan. 1980, pp. 3688-3691, New York, U.S.; R. C. Varshney: "Polysilicon Oxide Process . . . ".
IEDM International Electron Devices Meeting, Washington D.C., 8-10 Dec. 1980, Technical Digest, Papier 6.3, pp. 140-143, IEEE, . . .

Primary Examiner—Upendra Roy
Attorney, Agent, or Firm—Roland Plottel

[57] ABSTRACT

A method is provided for obtaining a diode whose contact tapping is self aligned with a gate, consisting in depositing on a semiconductor substrate at least a first layer of a dielectric material, depositing on the last dielectric layer a first layer of polycrystalline silicon so as to form the gate, then a second polycrystalline silicon layer above the first layer, etching in the polycrystalline silicon layers the position of the contact diode until the dielectric layer is laid bare, oxidizing the second polycrystalline silicon layer sufficiently for the oxidized layer to completely cover the first polycrystalline silicon layer forming the gate and only to partially cover the part of the dielectric layer laid bare, and doping the portion of the substrate not covered by the oxide layer so as to form the junction of the diode.

6 Claims, 26 Drawing Figures

METHOD OF OBTAINING A DIODE WHOSE CONTACT TAPPING IS SELF ALIGNED WITH A GATE

BACKGROUND OF THE INVENTION

The present invention relates to a method of obtaining a diode whose contact tapping is self aligned with a gate.

The invention applies more particularly to the formation of contact tappings at the level of the drain or source junctions of unipolar transistors known under the name MOS which is the abbreviation of "Metal Oxide Semiconductor" and those of the photosensitive elements of the line transfer matrixes.

To obtain a small sized diode with contact tapping adjacent one or more gates, isolated from the diode by insulating materials, it is known to use a photolithographic process consisting in creating successively on a dielectric layer covering a semiconductor substrate, first of all a photogate then a photodiode aligned with the photogate and finally a photocontact isolated from the grid. In this process, the diode is self positioned with respect to the gate, but the contact tapping must be formed after the oxidation which follows the implantation by diffusion of impurities which form the junction of the diode, thus it is not possible to accurately position the contact zone with respect to the gate, there exists then a risk of short circuiting between the diode and the gate, through the metallization.

SUMMARY OF THE INVENTION

The aim of the invention is to overcome the above drawbacks.

For this, the invention provides a method for obtaining a diode whose contact tapping is self aligned with a gate and which consists in depositing on a semiconductor substrate at least a first layer of a dielectric material, in depositing on the last dielectric layer a layer of polycrystalline silicon so as to form the gate, then a second layer of polycrystalline silicon above the first layer in etching in the polycrystalline silicon layers, the position of the contact diode until the dielectric layer is bared, in oxidizing the second polycrystalline silicon layer sufficiently for the oxidized layer to completely cover the first silicon layer forming the gate but only to partially cover the bared portion of the dielectric layer and in doping the portion of the substrate not covered by the oxide layer so as to form the junction of the diode.

The main advantage of the method of the invention is that a contact may be formed for interconnection with the diode, having the same dimensions as this latter and self aligned with respect to a gate because the diode, the contact and a portion of the gate are formed with the same masking level. Another advantage provided by the invention is that of not requiring a photolithographic operation, which improves the compactness of the products obtained. It also reduces the depth of the junction of the diode, this latter being able to be formed just before the aluminum metallization of the contact tappings. Furthermore, the process of the invention does away with the risks of short circuiting the gates with the adjacent elements.

BRIEF DESCRIPTION OF THE DRAWINGS

Other features and advantages of the invention will appear during the following description, with reference to the accompanying drawings in which.

DETAILED DESCRIPTION OF THE INVENTION

Figure 1A:
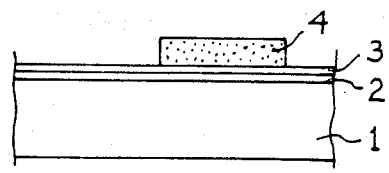
FIGS. 1A, 1B and 1C show the phases of a method for obtaining a contact diode according to the prior art.
Figure 1B:
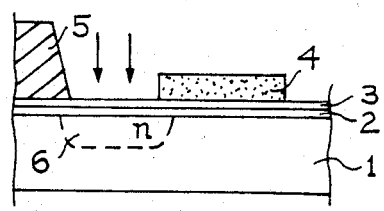
Figure 1C:
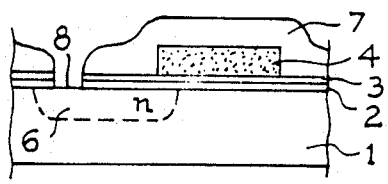
Figure 2A:
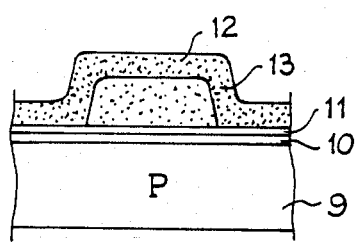
FIGS. 2A to 2D show the phases of the process for obtaining a contact diode in accordance with the invention.
Figure 2B:
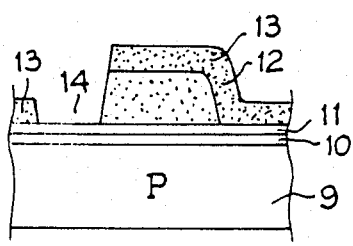
Figure 2C:
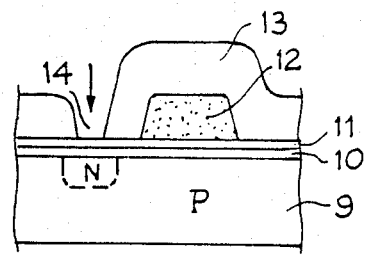
Figure 2D:
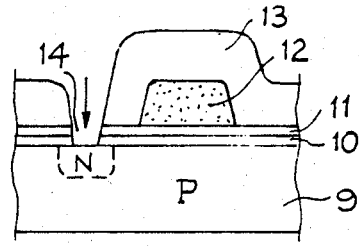

In the process illustrated in FIGS. 1A, 1B, and 1C which show the phases for obtaining a contact diode using a photolithographic method of the prior art, a photogate is first of all formed in a way shown in FIG. 1A by depositing on a semiconductor substrate 1 a first silica layer 2, then a second silicon nitride layer 3 above the silica layer 2, and finally in forming a gate by photolithography 7 a conducting silicon layer 4. The photodiode is then formed, in the way shown in FIG. 1B by ionic implantation in a zone 6 of substrate 1, self aligned with gate 4 through a mask 5. The photocontact is then formed in the step shown in FIG. 1C by depositing an oxide layer 7 over the gate silicon layer 4, then by etching the nitride layer 3 and deoxidizing the silica layer 2 so as to have access to substrate 1 and to form the contact opening 8. Referring to FIG. 1C it is apparent that the process which has just been described does not allow the contact opening 8 to be positioned with respect to gate 4 with sufficient accuracy for eliminating any risk of short circuit between the contact which will be subsequently formed in the access opening 8 to diode 6 and gate 4.

The method of the invention which is described hereafter with reference to FIGS. 2A to 2D overcomes this drawback. It consists, in a first step shown in FIG. 2A, in depositing on a silicon substrate 9 a first silica layer 10 then a second silicon nitride layer 11 above the first silica layer 10, then in photoetching the gate to be formed on a first polycrystalline silicon deposit 12 then in coating the first silicon layer 12 with a second polycrystalline silicon layer 13. In the next step, shown in FIG. 2B, the polycrystalline silicon layers 12 and 13 are etched so as to lay the silicon nitride layer 11 bare inside a window 14 opened at the position where the diode is to be formed. Then, in the step shown in FIG. 2c, the silicon layer 13 is oxidized so as to isolate the gate formed by the polycrystalline silicon layer 12. Finally, in the step shown in FIG. 2D, the silicon nitride layer 11 and the silica layer 10 are etched so as to bare the upper face of the substrate in the windoe 14 formed by the preceding etching, and the diode is formed inside the windoe 14 by ionic implantation or by diffusion of impurities in the substrate 9 within the window 14, which has the advantage of requiring a minimum time for printing the implanted or diffused impurities and allowing a smaller junction depth to be obtained. It will be noted that the embodiment which has just been described is not the only one and that, in a variant of the method of the invention, the diode may be formed in the step shown in FIG. 2C after oxidation of the silicon layer 13 by implantation through the double silica 10 and silicon nitride 11 layer. In one or other variant, the method of the invention allows a contact to be obtained for interconnection with the diode having the same dimensions as the diode itself, which improves the compactness of the products obtained and makes it possible in the first case to reduce the junction depth of the diode which may be formed just before the metalization operation, by the aluminum, for example, of the contact tappings. These features of the invention allow it to be applied very efficiently to the construction, either of line transfer matrix photosensitive elements, or to the formation of MOS transistor source and drain contact tappings.

Figure 3A:
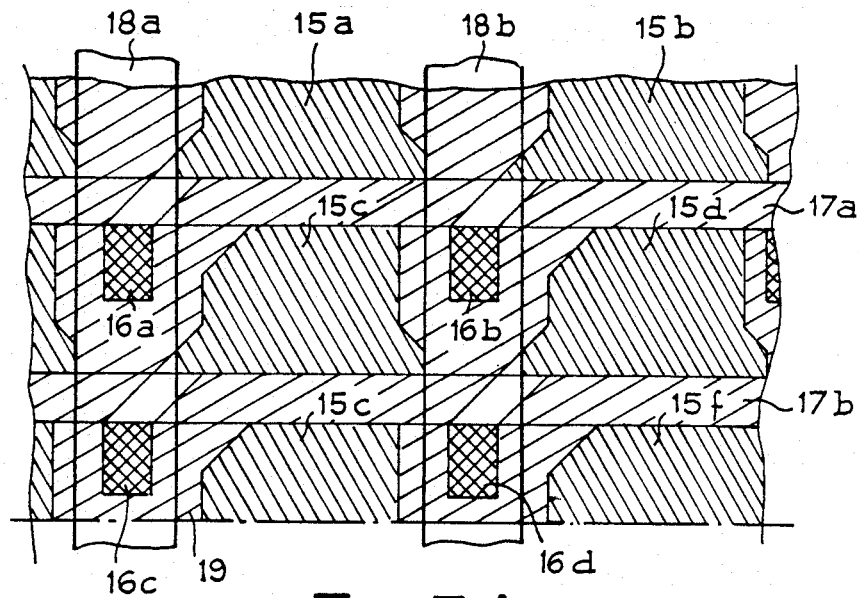
FIGS. 3A and 3B show two methods of forming photosensitive elements obtained respectively by the process shown in FIGS. 1A to 1C and by the process of the invention shown in FIGS. 2A to 2D.
Figure 3B:
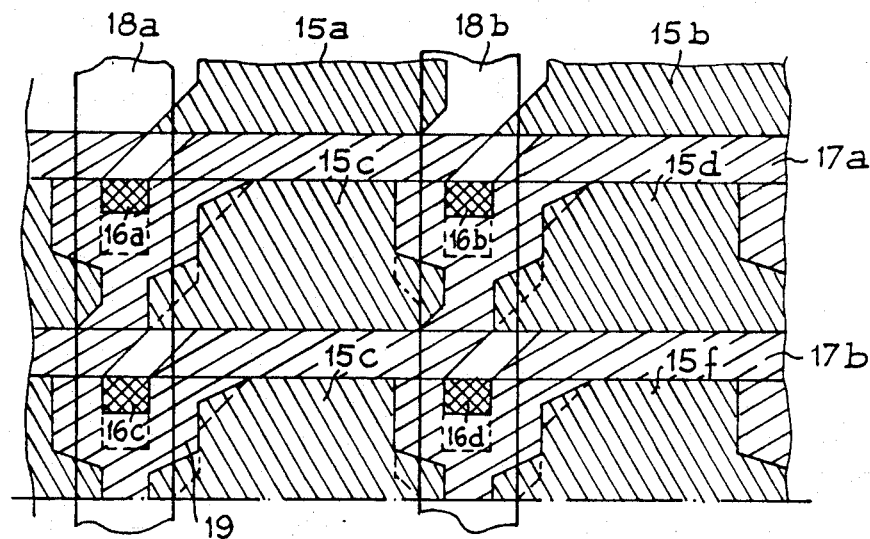

One embodiment of photosensitive elements for a line transfer matrix is described hereafter with reference to the diagrams shown in FIGS. 3A and 3B. FIG. 3A shows a line transfer matrix having diodes with contact tappings obtained by the process of the prior art described previously with reference to FIGS. 1A and 1B. The matrix shown is formed of four parts, the first part is formed by an assembly of storage diodes 15A to 15F representing photosensitive surface elements, a second part is formed by an assembly of reading diodes 16A to 16D, a third part is formed by gates 17A to 17B for controlling the passage of electric charges between the storage diodes and the reading diodes, and a fourth part is formed by the interconnection lines 18A, 18B connected to the reading diodes for transferring the charges read, for example, to an external CCD reading strip. In this configuration the interconnection lines are perpendicular to the gates controlling the passage of the charges and a thick oxide 19 isolates the photosensitive surfaces 15A to 15F of the reading diodes 16A to 16D.

Figure 4A:
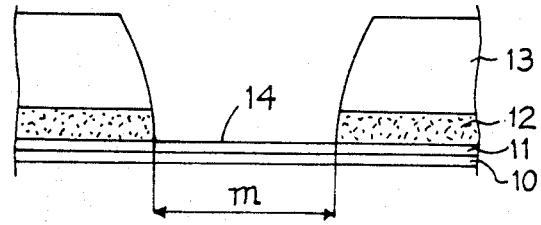
FIGS. 4A and 4B show a contact opening obtained by applying the process of the invention.
Figure 4B:
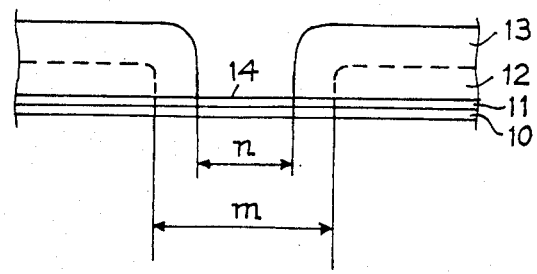
Figure 5:
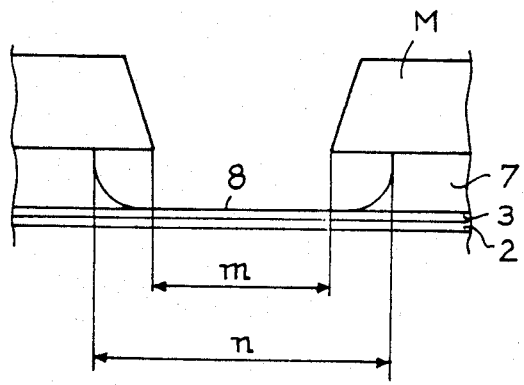
FIG. 5 is a representation by contrast with the drawing of FIG. 4B of a contact opening obtained with usual photolithographic processes.

The process of the invention, applied to the manufacture of line transfer matrices of the type which has just been described with reference to FIG. 3A allows the storage surfaces to be privileged for increasing the sensitivity of each of the storage elements 15a to 15f. By reducing the area occupied by each of the reading diodes 16a to 16e, it becomes possible, in the way shown in FIG. 3b, to increase the area of each of the storage diodes 15a to 15f by self aligning each of the reading diodes 16a to 16d with their respective passage gates 17a and 17b and by controlling the contact opening formed above each diode 16a to 16d. Contrary to the known process described above with reference to FIGS. 1A to 1C, the method of the invention allows the dimensions of the contact opening to be controlled as a function of the thickness of the silicon layer 13 used. In the contact openings shown for example in FIGS. 4a and 4b, the contact dimension N which is obtained depends, on the one hand, on the nominal dimension m of the window formed in the silicon layer 12 and, on the other hand, on the thickness of the oxide formed 13. In fact, referring again to FIG. 3B, it can be seen that the greater the thickness of the oxide formed 18, the more the dimensions of the contact opening of the diode 16a to 16d are reduced and the more possible it becomes to increase the photosensitive surface of the storage diodes 15a to 15f. This result runs counter to the results obtained by traditional processes for, referring again to FIG. 1c, the contact opening in a conventional process consists in etching the isolating silicon oxide layer 7 through a mask M which results in obtaining an opening n, shown in FIG. 5, which can only increase as a function of the thickness of the oxide layer 7 formed with respect to the opening m formed in the mask M.

Figure 6A:
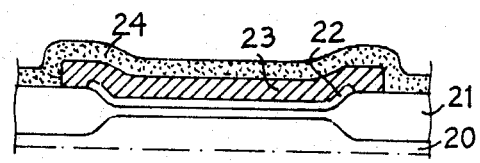
FIGS. 6A to 6D illustrate a first embodiment of an MOS transistor formed with the process of the invention, the diodes being formed in the final phase of the process.
Figure 6B:
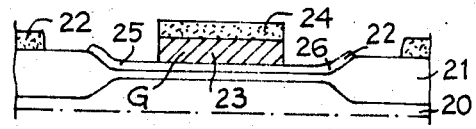
Figure 6C:
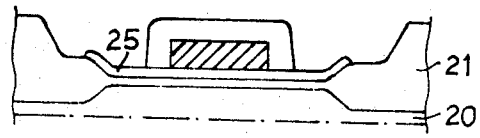
Figure 6D:
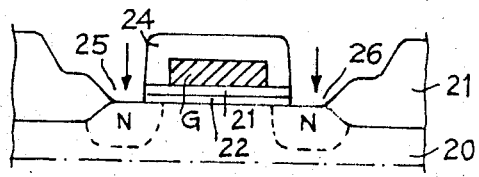

MOS transistor drain source contact tappings may be obtained using the method of the invention either by forming the contact diodes of the MOS transistor at the end of the procedure for obtaining the transistor, or by forming the diodes before the second silicon deposit. In the first case, shown in FIGS. 6A to 6D, the same procedure is followed as in FIG. 2A by depositing on a semiconductor substrate 20 a first silica layer 21 followed by a second silicon nitride layer 22 and above the silicon nitride layer 22 is deposited a first silicon layer 23, then a second silicon layer 24, this latter layer then being transformed into oxide so as to form the gate insulation. The silicon layers 23 and 24 are etched in the way shown in FIG. 6b so as to form the gate G of the transistor and two windows 25 and 25 situated on each side of the gate G. After oxide growth above the silicon layer 23 of the gate G (FIG. 6C), the silicon nitride layer 22 and the thin silicon oxide layer 21 are removed so as to give access to substrate 20 for operating an ionic implantation of substrate 20 through windows 25 and 26.

Figure 7A:
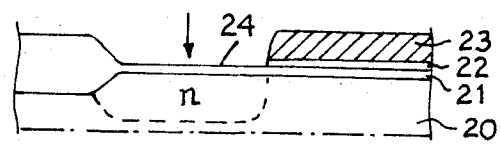
FIGS. 7A to 7E illustrate a second embodiment in which the diodes are formed before formation of the isolating oxide joined to the connections.
Figure 7B:
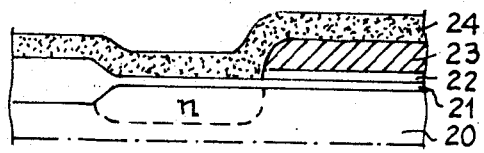
Figure 7C:
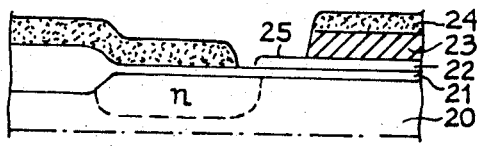
Figure 7D:
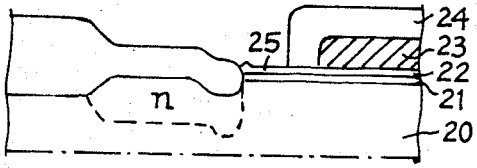
Figure 7E:
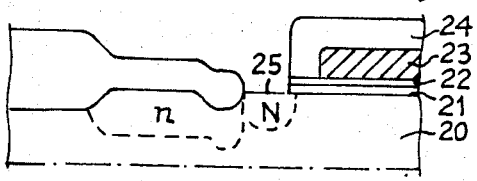
Figure 8A:
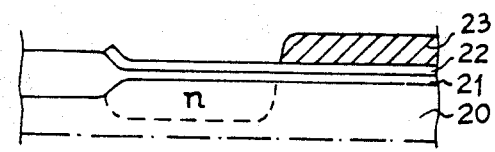
FIGS. 8A to 8E illustrate a third embodiment of the contact diodes, keeping the double nitride-oxide layer.
Figure 8B:
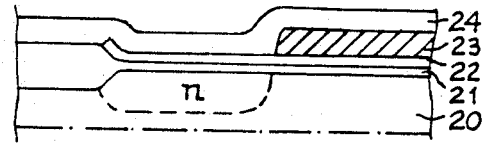
Figure 8C:
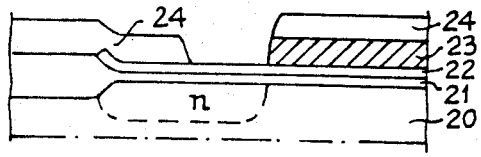
Figure 8D:
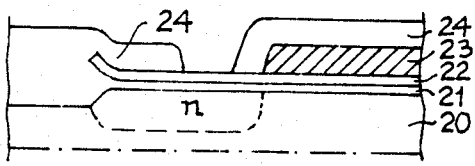
Figure 8E:
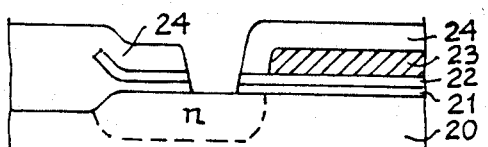

In the second case, shown in FIGS. 7A to 7E, the diodes are formed before formation of the gate-connection isolating oxide. Self alignment is then possible by protecting the silicon nitride by an excess in the gate of the future contact zone. The silicon layer 23 forming the gate is first of all coated with a layer of filler silicon 24 (FIG. 7B) then the filler silicon and the silicon layer forming the gate are etched so as to form window 25 (FIG. 7C) and so as to expose the silicon nitride layer 22 (FIG. 7D) so as not to have any discontinuities between the diode and the contact zone which will subsequently be doped (FIG. 7E).

The method of the invention is also applicable to the manufacture of diodes formed while keeping the double nitride-oxide layer, following the steps of the method shown in FIGS. 8A to 8E. In this method, after implantation (FIG. 8A) of the diode through the double silica 21 and silicon nitride 22 layer, the filler silicon 24 is deposited above the silicon layer 23 (FIG. 8B), then the filler silicon is etched in the way shown in FIG. 8C, self alignment may then be obtained by etchiing the silicon of the gate at the same time as the filler silicon layer and after the oxidization phase shown in FIG. 8D, the junction is accessed by etching the silicon nitride layer 22 and the thin oxide layer 21.

What is claimed is:

1. A method of obtaining a diode whose electrical contact is self-aligned with a gate, comprising the steps of depositing on a semiconductor substrate at least a first layer of dielectric material, depositing on the last dielectric layer a localized portion of a first layer of polycrystalline silicon for forming the gate, then a second polycrystalline silicon layer above the first layer, etching in the polycrystalline silicon layers essentially at the position desired for the diode until the dielectric layer is laid bare, oxidizing the substrate sufficiently to form an oxidized layer which completely covers the localized polycrystalline silicon layer and only partially covers the bared portion of the dielectric layer and doping the portion of the substrate not covered by the oxide layer so as to form the junction of the diode in such portion of the substrate.

2. The method as claimed in claim 1, wherein said dielectric material layer is formed of a first silica layer and a second silicon nitride layer, the first silica layer being interposed between the second silicon nitride layer and the substrate.

3. The process as claimed in claim 2, wherein doping of the substrate takes place by ionic implantation through the dielectric material layer.

4. The method as claimed in claim 2, further including laying bare the portion of the substrate not covered by the oxide layer while removing the dielectric layer covering this portion before the doping for forming the diode.

5. The method as claimed in claim 4, wherein doping of the diode in to the substrate is achieved by using a process of diffusing impurities in the substrate.

6. The process as claimed in claim 4, wherein doping of the diode in the substrate takes place by ionic implantation of ions in the substrate.

* * * * *